United States Patent
Lam et al.

(10) Patent No.: US 6,389,576 B1
(45) Date of Patent: May 14, 2002

(54) METHOD AND APPARATUS FOR OPTIMIZING REAL FUNCTIONS IN BOOLEAN DOMAIN

(75) Inventors: William Lam, Fremont; Thomas M. McWilliams, Menlo Park, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/389,297

(22) Filed: Sep. 2, 1999

(51) Int. Cl.[7] .................................... G06F 17/50

(52) U.S. Cl. .................... 716/2; 716/7; 703/2

(58) Field of Search .................... 716/1–21; 703/2

(56) References Cited

U.S. PATENT DOCUMENTS

| | | | |
|---|---|---|---|
| 5,434,794 A | * 7/1995 | Coudert et al. | 716/2 |
| 5,461,574 A | * 10/1995 | Matsunaga et al. | 716/2 |
| 5,469,367 A | * 11/1995 | Puri et al. | 716/18 |
| 5,712,792 A | 1/1998 | Yamashita et al. | |
| 5,748,486 A | * 5/1998 | Ashar et al. | 716/18 |
| 5,805,462 A | * 9/1998 | Poirot et al. | 716/18 |
| 5,966,523 A | * 10/1999 | Uchino | 703/2 |
| 6,035,109 A | * 3/2000 | Ashar et al. | 716/3 |
| 6,308,299 B1 | * 10/2001 | Burch et al. | 716/4 |

OTHER PUBLICATIONS

NA920662, "Determining the Height of Differential Cascode Voltage Switch Arrays", IBM Technical Disclosure Bulletin, vol. 35, No. 1A, Jun. 1992, pp. 62–66 (6 pages).*
Gunther et al., "Minimization of free BDDs", Proceedings of the ASP–DAC '99, Asia and South Pacific Design Automation Conference, vol. 1, Jan. 18, 1999, pp. 323–326.*
Ashar et al., "Boolean satisfiability and equivalence checking using general binary decision diagrams", Proceedings of the 1991 IEEE International Conference on Computer Design: VLSI in Computers and Processors, Oct. 14, 1991, pp. 259–264.*
Aagaard et al., "Formal verification using parametric representations of Boolean constraints", Proceedings of 36th design Automation Conference, Jun. 21, 1999, pp. 402–407.*
Bose et al., "Sequential path delay test generation by symbolic analysis", Proceedings of the Fourth Asian Test Symposium, Nov. 23, 1995, pp. 353–359.*
Yu et al., "BDD–based synthesis of extended burst–mode controllers", IEEE Transactions on Computer–Aided Design of Integrated Circuits and Systems, vol. 17, No. 9, Sep. 1998, pp. 782–792.*
Bechir et al., "Cyclogen: automatic, functional–level test generator based on the cyclomatic complexity measure and on the ROBDD representation", IEEE Transactions on Circuits and Systems II: Analog and Digital Signal Processing, vol. 42, No. 7, Jul. 1995.*

(List continued on next page.)

*Primary Examiner*—Matthew Smith
*Assistant Examiner*—Phallaka Kik
(74) *Attorney, Agent, or Firm*—The Hecker Law Group

(57) ABSTRACT

The invention is a method and apparatus for optimizing a real function in the Boolean domain. In accordance with an embodiment of the method, the real function is represented as a Boolean function. A binary decision diagram for the Boolean function is generated, the binary decision diagram having a root and at least one variable node. The number of vertices for at least one variable node of the binary decision diagram is determined. The function is optimized by selecting a path or paths from the root to at least one variable node of the binary decision diagram having the least number of vertices. The solution values of one or more variables of the Boolean function are determined in accordance with the path(s) through the binary decision diagram. These values comprise an optimized solution set for the real function.

19 Claims, 8 Drawing Sheets

OTHER PUBLICATIONS

Bhattacharya et al., "Test generation for path delay faults using binary decision diagrams", IEEE Transactions on Computers, vol. 44, No. 3, Mar. 1995, pp. 434–447.*

Bahar et al., "Algebraic decision diagrams and their applications", 1993 IEEE/ACM International Conference on Computer–Aided Design, ICCAD–93, Digest of Technical Papers, Nov. 7, 1993, pp. 188–191.*

Bryant, Randal E., "Graph–Based Algorithms for Boolean Function Manipulation," IEEE Transactions on Computers, Aug. 1986, pp. 677–691, vol. C–35, No. 8.

Oliver Coudert, "Solving Graph Optimization Problems with ZBDDs", European Design and Test Conference, 1997.

* cited by examiner

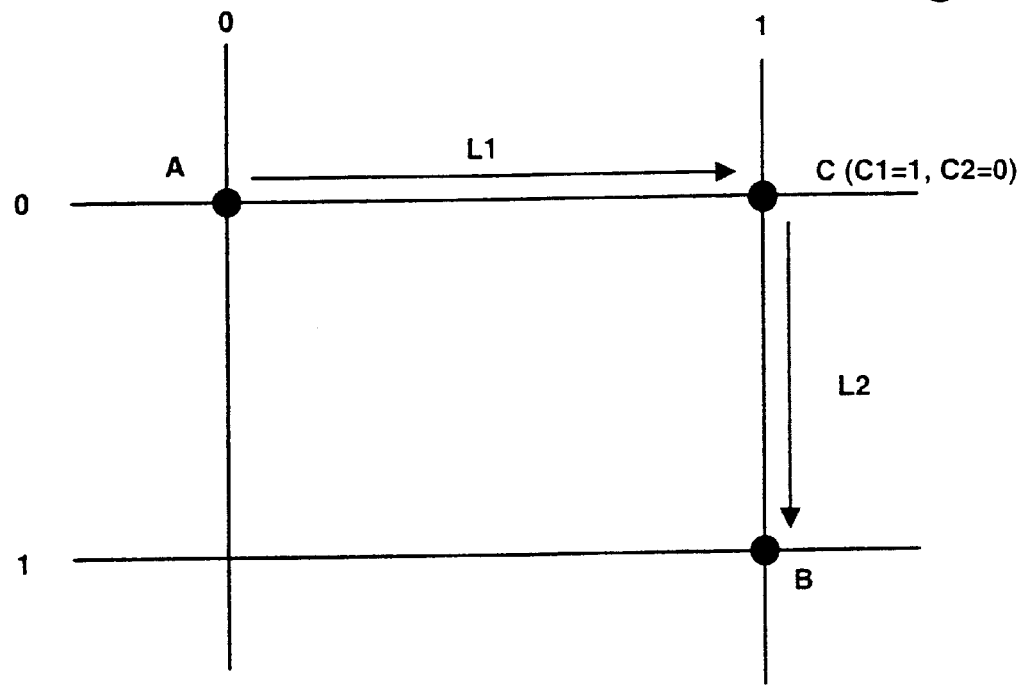
(a)
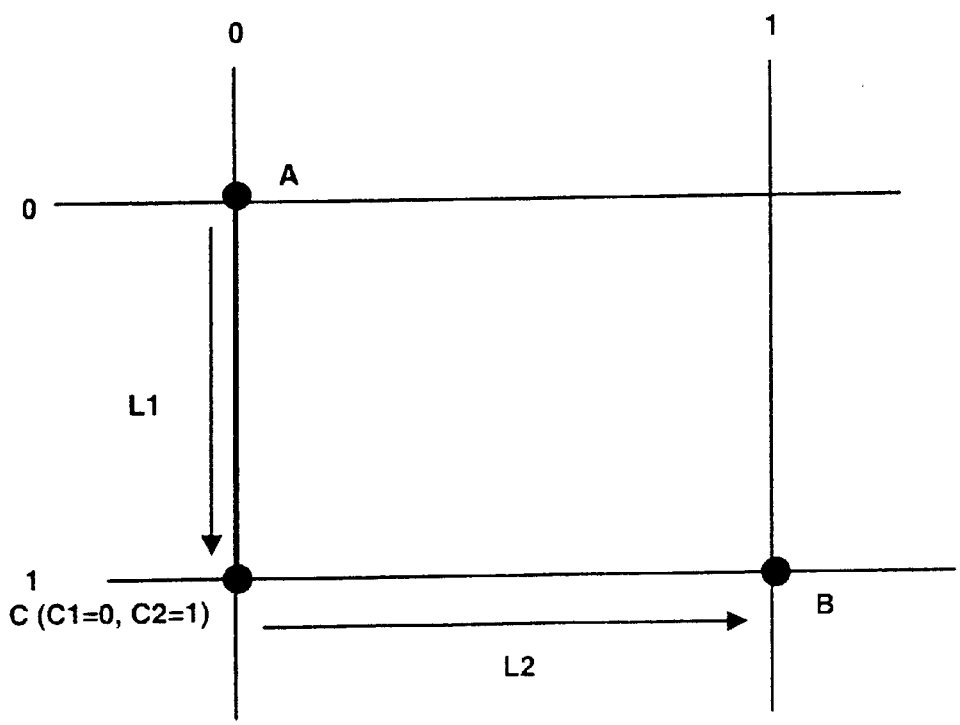
(b)
Figure 6

METHOD AND APPARATUS FOR OPTIMIZING REAL FUNCTIONS IN BOOLEAN DOMAIN

BACKGROUND OF THE INVENTION

1. Field of the Invention

This invention relates to a method and apparatus for optimizing a real-value function in Boolean domain.

2. Background Art

The design of a circuit involves both identifying circuit components necessary to accomplish one or more functions and determining a physical arrangement of the identified circuit components. It is generally desirable to find an optimal circuit design which minimizes the size and cost of the circuit and maximizes the speed and efficiency of the circuit.

Optimization of the circuit components which are to comprise a circuit is generally accomplished in the Boolean domain. Circuit components for generating the desired circuit function are represented by one or more Boolean operators, such as AND/XOR etc., with each operator or combination of operators representing an electronic "gate" or component. Once the components of a desired circuit have been represented with the appropriate Boolean operators, it is possible to optimize the circuit using the known laws of Boolean algebra.

Application of these laws may permit the various Boolean operators representing the circuit to be reconfigured, such as by lessening the total number of operators (and hence circuit components) needed to create the desired circuit. The various operators of the optimized Boolean operator set are then converted back into corresponding real circuit components, i.e. transistors, diodes, etc.

Once the circuit components are known, the layout of these components is performed in the real domain (i.e. non-Boolean domain). The various components may be mapped into Cartesian coordinates and moved about until their arrangement is optimized. For example, the optimum arrangement of the components may be that where they occupy the least space or have the shortest interconnect distances.

A significant problem associated with this method of circuit design is that the circuit component determination and component layout portions of the design phase are performed independently. As a result, optimal circuit design conditions which are achieved in one portion of the design phase may be unusable in a later portion of the design phase. As an example of this problem, the optimal choice of circuit components might differ if it were possible to consider the layout or arrangement of the components at the same time as the possible combinations of the components.

A source of this problem is that the two portions of the design phase are performed independently, the circuit component portion of the design phase being performed in the Boolean domain and the layout portion performed in the real domain.

It would be advantageous if the two portions of the design phase, i.e. that in the Boolean and real domains, could be merged. It would be advantageous if the domains could be merged and optimization in both domains realized when optimization in the Boolean domain is accomplished.

SUMMARY OF THE INVENTION

The invention is a method and apparatus for optimizing a real function in the Boolean domain.

In accordance with one embodiment of the method, the real function is represented as a Boolean function. A binary decision diagram for the Boolean function is created, the binary decision diagram having a root and at least one variable node. The number of vertices for at least one variable node of the binary decision diagram is determined.

The function is optimized by selecting a path leading from the root to a variable node of the binary decision diagram having the least number of associated vertices. The solution values of one or more variables of the Boolean function are determined in accordance with the path(s) through the binary decision diagram. These values comprise an optimized solution set for the real function.

In one or more embodiments, the method may be utilized to determine the shortest "interconnect" path between two or more points. In this arrangement, the Boolean function represents one or more segments of an interconnect having end-points at the points to be connected. Solution values for the connecting points of the segment of the interconnect are yielded from the path through the binary decision diagram.

In one or more embodiments, computer hardware and/or software is arranged to perform the method of the invention.

Further objects, features and advantages of the invention will become apparent from the detailed description of the drawings which follows, when considered with the attached figures.

BRIEF DESCRIPTION OF THE DRAWINGS

FIG. 6(a) graphically illustrates a first solution for the problem represented in FIG. 4;

FIG. 6(b) graphically illustrates a second solution for the problem illustrated in FIG. 4;

DETAILED DESCRIPTION OF THE INVENTION

Figure 1:
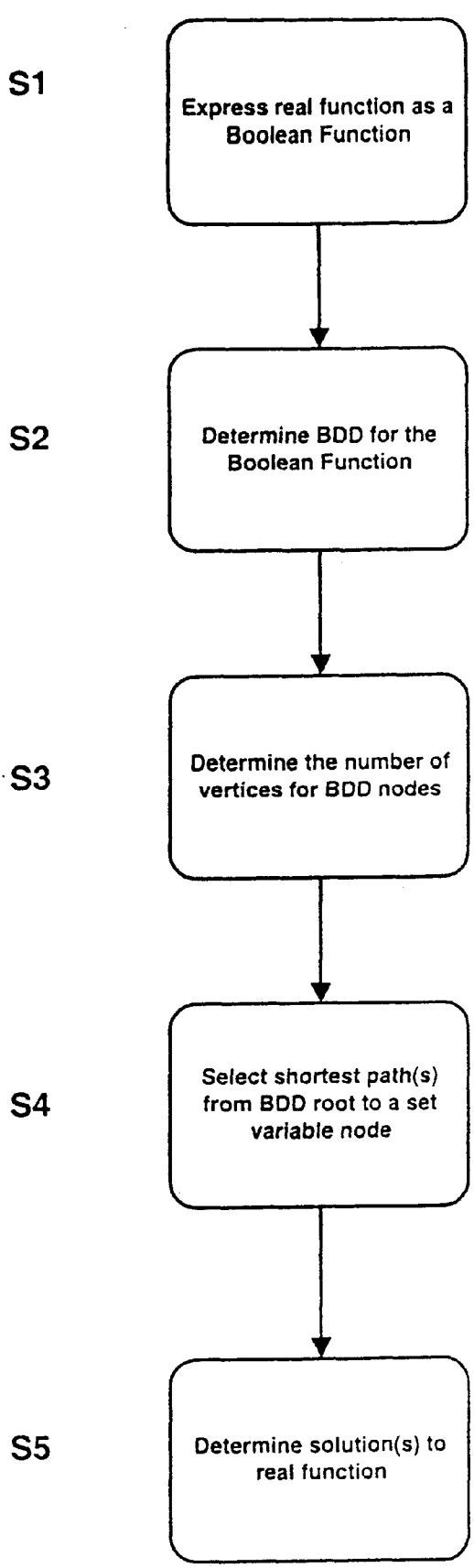
FIG. 1 is a flow diagram of one embodiment of a method of the invention.

The invention is a method and apparatus for optimizing a real-value function in Boolean domain. In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

Portions of the disclosure of this patent document may contain material that is subject to copyright protection. The copyright owner has no objection to the facsimile reproduction by anyone of the patent document or the patent disclosure as it appears in the Patent and Trademark Office file or records, but otherwise reserves all copyright rights whatsoever. Sun, Sun Microsystems, Java and all Java-based trademarks and logos are trademarks or registered trademarks of Sun Microsystems, Inc. in the United States and other countries. All SPARC trademarks are used under license and are trademarks or registered trademarks of SPARC International in the United States and other countries. Products bearing SPARC trademarks are based upon an architecture developed by Sun Microsystems, Inc.

Method of Optimizing A Real-Value Function In Boolean Domain

One or more embodiments of the invention comprise a method for optimizing a real-value function in Boolean domain. In one or more embodiments, the method may be utilized to determine the minimal distance or length for an interconnect connecting two or more points. The points may comprise, for example, terminals or components of a circuit.

As used herein, the term "Boolean domain" is intended to mean that mathematical domain closed over the values of zero (0) and one (1), the domain including a variety of operations which may be performed on or with these values, generally known as Boolean algebraic operations. These Boolean operations, such as "OR" "AND" "NOT" and "NAND" are well known, as are the rules, theorems, and postulates of Boolean algebra. The term "Boolean function" as used herein means a function in the Boolean domain.

The term "real function" or "real-value function" as used herein is intended to mean a function which is not exclusively in the Boolean domain. For example, a real-value function may comprise values other than zero (0) and one (1), and may include operations other than Boolean algebra operations.

One embodiment of a method of the invention will be described with reference to FIG. 1. In a first step S1, a real-value function or problem is represented as a Boolean function. The particular Boolean representation of the real-value function is dependent upon the particular real-value function.

In one or more embodiments, the Boolean function represents one or more segments of an interconnect for connecting two or more points, such as components or terminals of a circuit, avoiding obstacles, if any, and satisfying other constraints, if any.

There are a variety of ways for deriving a Boolean function which represents a certain real value function. One embodiment of a method for representing a real-value function as a Boolean function is illustrated in FIG. 2 and will be described in conjunction with a specific example illustrated in FIG. 3.

Figure 3:
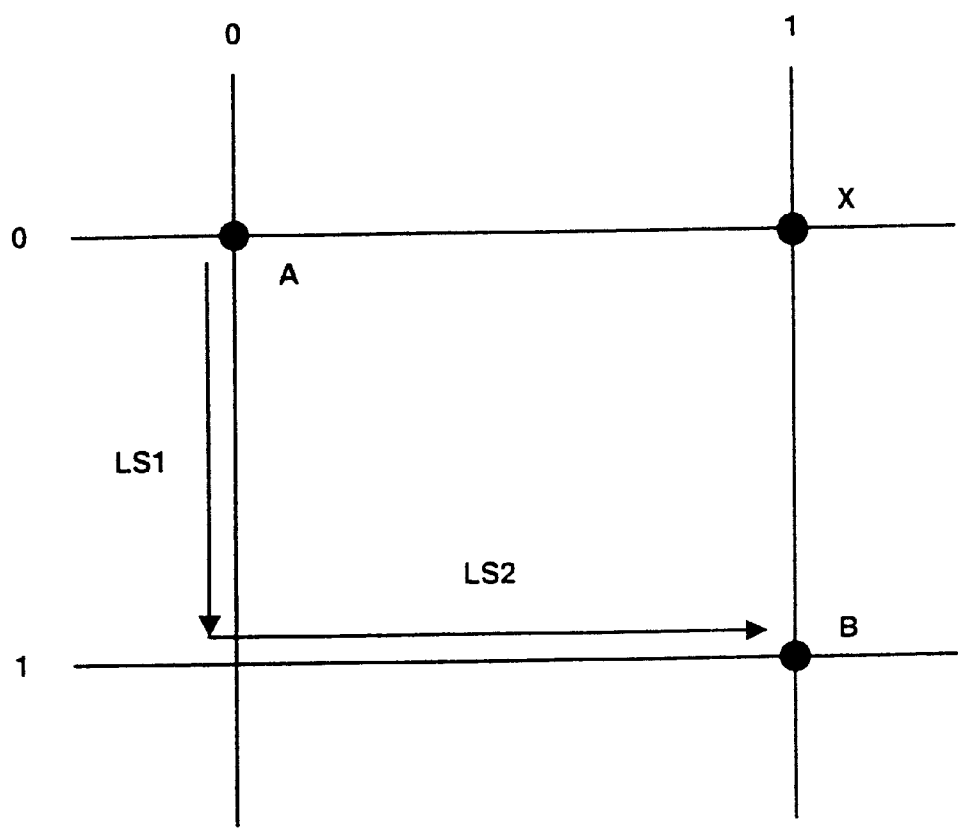
FIG. 3 illustrates a Manhattan grid with two points A and B to be connected and obstacle X to be avoided.

FIG. 3 graphically illustrates a real-value problem where it is desired to connect terminals or points A and B with the shortest length interconnect which extends in real Manhattan space and which avoids obstacle X. By "Manhattan" space it is meant a space defined by horizontal and vertical grid of lines extending perpendicular to one another. In this space, points may only lie on the grid lines, and objects have boundaries or sides defined by one or more grid lines.

Figure 2:
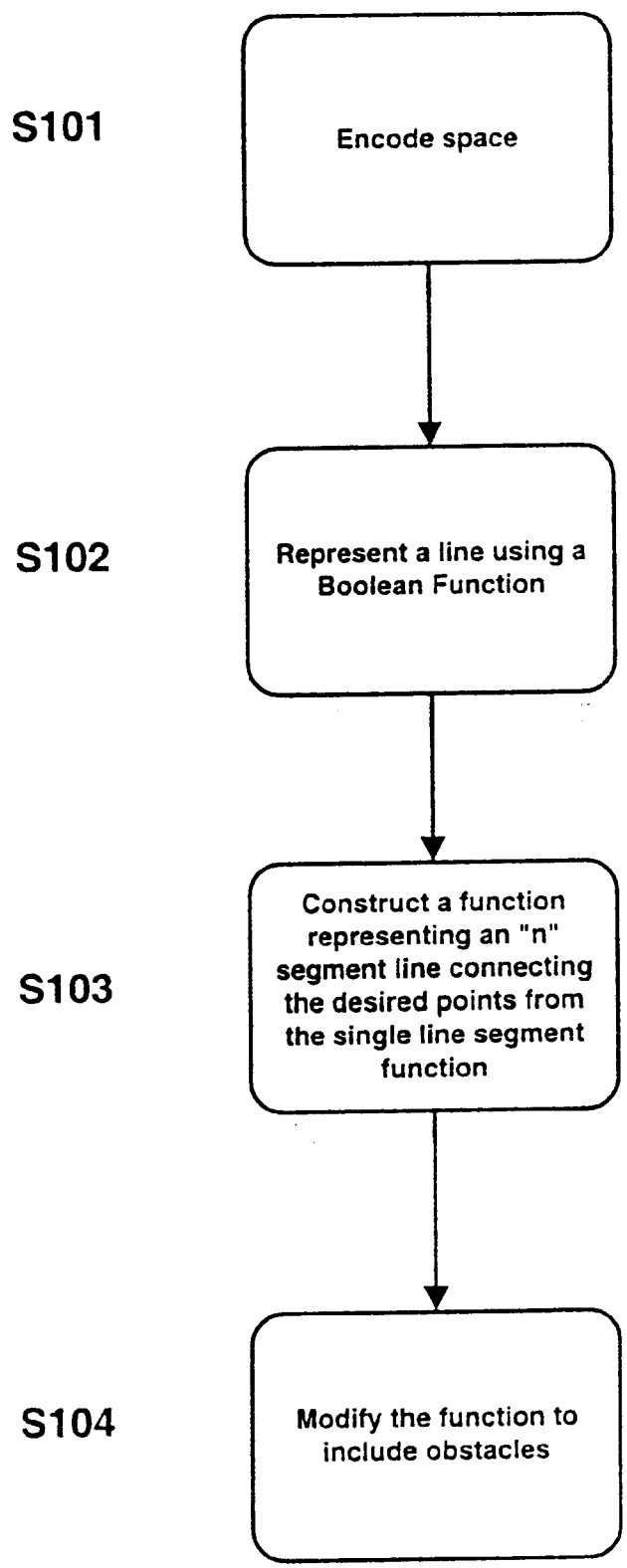
FIG. 2 is a flow diagram of a method for generating a Boolean function representing a real function in accordance with an embodiment of the invention.

Referring to FIG. 2, in a first step S101, the space in which the terminals and obstacle lie is encoded. In one or more embodiments, the space is "Grey-code" encoded. Grey-code has the characteristic that adjacent nodes or vertices of a gridded space differ in only one bit, each bit comprising only one (1) or zero (0) values (i.e. each coordinate of the Grey-coded space is represented by combinations of the binary values one (1) and zero (0).

The Grey-code of a point (x,y) in the space is obtained by concatenating the codes of the x and y coordinates, i.e. coordinates (x,y)=code(x)code(y). Grey-coding of coordinates in this manner is well-known.

In the example illustrated in FIG. 3, the coordinates of each point can be represented by a two-bit Grey-code, such as (0,1) (1,1) or the like, where the first bit represents the "x"-axis value and the second bit the "y"-axis value. When the grid is larger, the number of bits necessary to represent the coordinates is correspondingly larger. For example, the particular coordinates of a point may comprise (0010111), where the first four bits (0010) represent the "x"-axis coordinate and the last three bits (111) represent the "y"-axis coordinate.

Next, in a step S102, a Boolean function is derived which generally represents a line or interconnect connecting the points, in this case points A and B. In the specific example illustrated in FIG. 3, this Boolean function F may be said to have three variables R, S and P, where R and S represent end-points of the line and P represents a point on the line. Each variable R, S and P may be represented in two-bit fashion by its Grey-code coordinates. For example, point R may be represented by R=(R1,R2) where R1 is the "x"-axis value and R2 is the "y"-axis value of the coordinates of the point R, as stated above.

The Boolean function is derived from all possible combination of points R, S and P as represented by their Grey-coded coordinates. If R is 00 and S is 10, then all the points the line has are 00 and 10; thus F(R,S,P) contains the vertex 001000 and 001010, where the first two bits come from R, the next two from S, and the last two from P. This is repeated for all combinations. In the example illustrated in FIG. 3, the function F (R,S,P) may be represented as:

$$F(R,S,P)=R(00)S(00)P(00)+R(00)S(10)[P(00)+P(10)]+R$$
$$(10)S(10)P(10)+R(10)S(00)[P(00)+P(10)]+R(01)S(01)P$$
$$(01)+R(01)S(11)[P(01)+P(11)]+R(11)S(11)P$$
$$(11)+R(11)S(01)[P(01)+P(11)]+R(00)S(01)[P(00)+P(01)]+$$

where the 0 and 1 values in parenthesis represent the x and y-axis coordinates for the particular point. This function represents a line with an arbitrary starting point R and ending points, and having an arbitrary length.

Next, in a step S103, a second Boolean function representing an "n"-segment line connecting the desired points (in this case A and B) is constructed from the Boolean function representing the single line which was derived in step S102. The number "n" representing the number of segments of the interconnect may be selected by considering a number of factors. The value of "n" may be selected by examining the gridded space and selected points and evaluating a number of segments which may be used to connect the points.

As described in greater detail below, the selected number "n" may ultimately be larger than the minimum number of segments which are necessary to connect the points or terminals. In the method of the invention, if a solution exists to the problem where the number of interconnect segments is less than the number of "n" segments selected (i.e. "n−1," "n−2" segments etc.), these solutions will be provided when solving the problem for "n" segments. The number "n" is generally selected to be as small as possible so that the problem is less complex and easier to solve. If no solution is provided for the problem for a chosen number "n" then it may be necessary to choose a large value for "n." These factors may also be considered when selecting a value for "n."

In the example illustrated in FIG. 3, it appears that a 2-segment interconnect which follows the grid and connects the points A and B, but avoids the obstacle X (see the interconnect represented by segments LS1 and LS2) may render a solution, so "n" is selected as two (2).

Each segment of the "n" segment interconnect can be represented as a line segment L. A Boolean function F is defined which represents an interconnect extending between points R and S, the interconnect having two segments L1 and L2. At least one of the line segments must have as a terminus point R, and at least on e line segment must have as a terminus point S. In addition, the function must be defined so that each of the line segments forming the interconnect are connected to one another. In a two line segment, the line segments L1 and L2 must be constrained to join at a point C.

In the example illustrated in FIG. 3, point R comprises point A and point S comprises point B. The resultant Boolean function representing the line segments which extend from points A and B and which connect at point C may be represented as:

$$F(C,P)=[L1(A,C,P)+L2(C,B,P)]L1(A,C,C)L2(C,B,C).$$

In this function, L1(A,C,P) is derived from the previously defined Boolean function F(R,S,P) where point R=A and point S=C, and L2(C,B,P) is derived from the function F(R,S,P) where point R=C and point S=B. The first part of this equation [L1(A,C,P)+L2(C,B,P)] is the Boolean OR of the represented line segments, and is satisfied if point P lies on either or both line segments. This result is Boolean "ANDed" with the term L1(A,C,C)L2(C,B,C), this term forcing the line segments L1 and L2 to interconnect at point C.

This equation can be simplified to include the individual bit-wise coordinate components of points C and P. In this equation, C is represented by its Grey-code coordinates C1 and C2 and P is represented by its Grey-code coordinates P1 and P2. The function F(C,P) then reduces to:

$$F(C,P)=C1!C2!P2+!C1C2P2+!C1C2!P1+C1!C2P1.$$

In this equation, "!" indicates the Boolean "NOT" of the variable, "+" represents the Boolean "OR" operator, and the in-succession variables are Boolean "ANDed."

In a step S104, the Boolean function constructed in step S103 if modified, if necessary, to include constraints. In the example illustrated in FIG. 3, the constraint comprises obstacle X which must be avoided by the interconnect. In this specific example, this modified function M may be represented as:

$$M(C,P)=F(C,P)!F(C,X).$$

The function F(C,P) is the Boolean function derived above, and the function !F(C,X) is the Boolean "NOT" of the function F(C,X), which is a Boolean function representing the obstacle. The expression F(C,P) evaluates to one (1) if an "n"-segment (2 segments in this example) interconnect connecting points A and B exists, and !F(C,X) is one (1) (or F(C,X) is 0) when the obstacle X is not on the interconnect or does not lie along the path connecting the points.

This function can be simplified to M(C,P)=!C1C2 (!P1+P2). In this function, C1 and C2 again represent the bits of the Grey-code coordinates for point C, and P1 and P2 represent the bits of the Grey-code coordinates for a point P. !C1 and !P1 represent the Boolean "NOT" of C1 and P1, respectively. In this function, !C1 and C2 are Boolean "ANDed" and then "ANDed" with the Boolean "OR" of !P1 and P2.

This function may be solved to determine the various points "C" which form the interconnect of the line segments L1 and L2. The Boolean function M(C,P) is satisfied (i.e. has a value of 1) when, notwithstanding the actual values of P1 and P2, C1=0 and C2=1 (for the example shown above). Solving the function at this stage, however, only provides information about the various interconnect points of different interconnects and does not indicate which path or interconnect is the shortest. In the above example, because of the location of the obstacle, only one path exists from point A to point B which avoids the obstacle. Situations may exist, however, where there are multiple interconnect paths which may be used to connect the desired points, and it is desirable to determine the shortest of those interconnects or paths. As such, and referring again to FIG. 1, in step S2 a binary decision diagram (BDD) is generated for the Boolean function. Binary decision diagrams are well known to those of skill in the art, and are described in greater detail in *Graph-Based Algorithms for Boolean Function Manipulation* by R. E. Bryant, IEEE Transaction on Computers, Vol. C-35 No. 8, August 1986 (pgs. 677–690).

In general, a binary decision diagram (BDD) is a directed acyclic graph of a Boolean function. The binary decision diagram has one root node and leaves or constant nodes comprising the Boolean constants zero (0) and one (1). The non-leaf nodes of the graph (including the root node) are nodes comprising variables of the Boolean function. Each non-leaf node has outgoing paths labelled zero (0) and one (1) leading to another node. In general, the diagram is illustrated such that the right-hand branch leading from a variable node has a value of one (1), and the left-hand branch leading from a variable node has a value of zero (0).

The result (i.e. output value) of the function is determined by following a path from the root through the variable(s) to one of the leaves, with the resultant function value equal to the value of the leaf (i.e. 0 or 1).

In one or more embodiments of the invention, the binary decision diagram is structured or ordered such that the root comprises a first of the variables for which a solution value is desired. Under the root, the remaining variable nodes are ordered first with those other variables for which a solution value is desired ("solution variables"), and then the variables for which no solution value is necessary ("set variables"), and finally with the constant nodes forming the leaves.

In the above-referenced examples, the variables "C" (such as C1 and C2) comprise solution variables since they comprise the coordinates solutions for the line-segment interconnect point. The variables "P" (such as P1 and P2) comprise set variables since point P represents an arbitrary point associated with the line segment(s).

Figure 4:
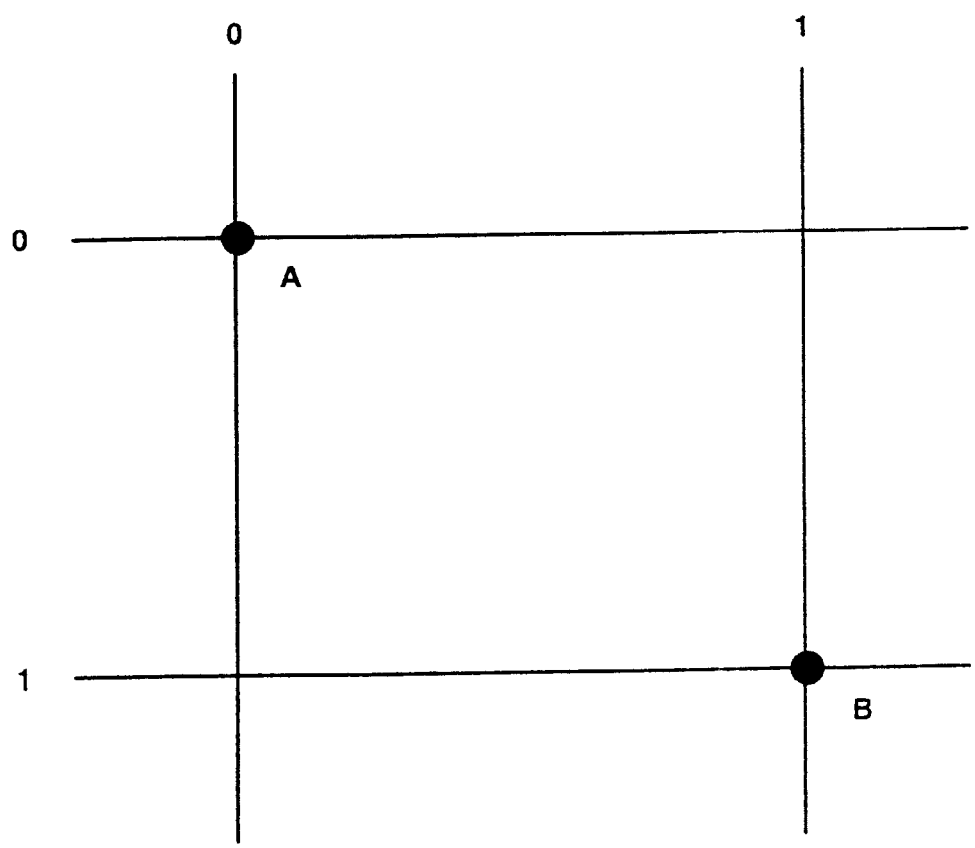
FIG. 4 illustrates a Manhattan grid with two points A and B to be connected.
Figure 5:
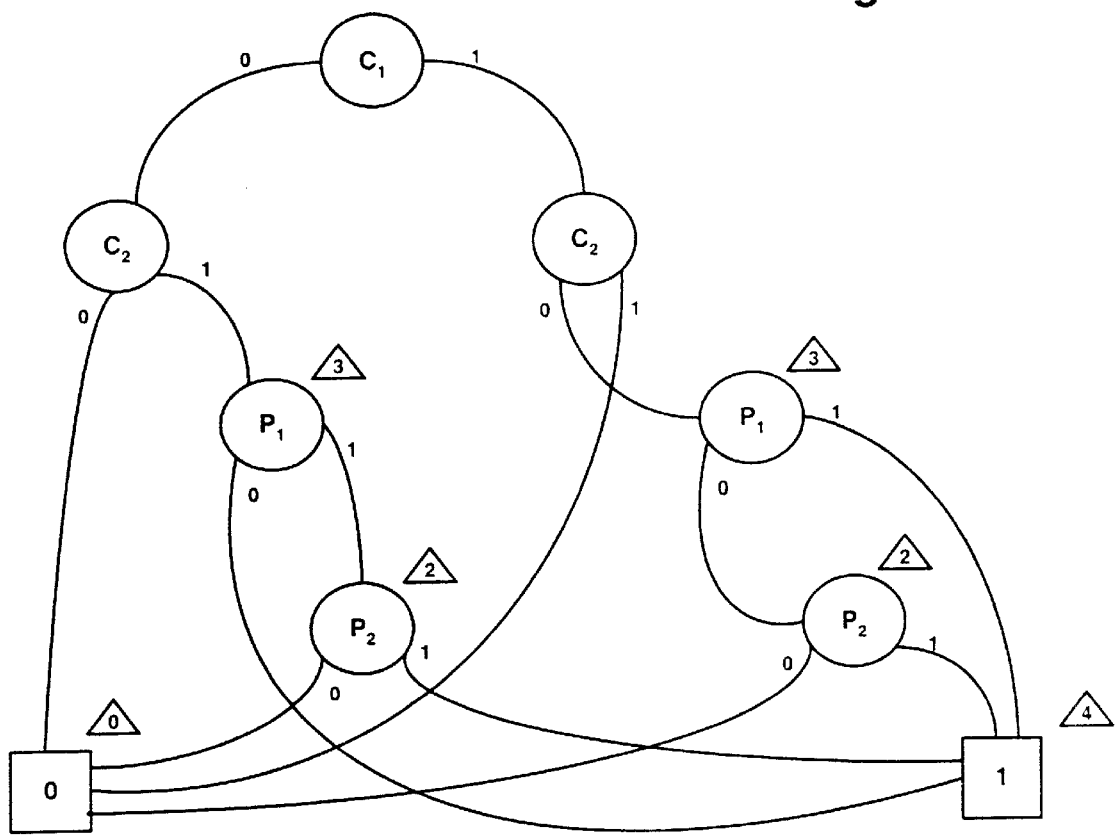
FIG. 5 illustrates a binary decision diagram.

FIG. 5 illustrates the binary decision diagram for a Boolean function representing the interconnect function for the real-value problem graphically illustrated in FIG. 4. FIG. 4 graphically illustrates a problem similar to that illustrated in FIG. 3, where it is desired to connect points A and B with the shortest length interconnect, but where there are no obstacles. The Boolean function for this real value problem is provided above (before the function was modified to include the obstacle):

$$F(C,P)=C1!C2!P2+!C1C2P2+!C1C2!P1+C1!C2P1.$$

In accordance with this function, one desires to determine the values of C1 and C2, as these values yield the Grey-code coordinates of the connecting point C of the line segments L1 and L2. It is not necessary to determine the values of P1 and P2, and as such these variables comprise the "set" variables. As such, the binary decision diagram is arranged with the root forming one of the variable nodes C1 or C2 (in the illustration, C1 has been chosen as the root), then the other of the variable nodes for which a solution value is desired (C2 in the illustrated example), then the set variables (P1 and P2) and then the leaves.

In a step S3, the number of vertices for the leaves and nodes of the binary decision diagram are computed or determined. The number of vertices may be calculated in accordance with an embodiment of the invention which is as follows: in a binary decision diagram representing a Boolean function of "n" variables, the number of vertices is $2^n$ for the constant or "leaf" node having a value of one (1), zero (0) for the constant or "leaf" node having a value of zero (0), and the sum of the vertices of the left and right children divided by two (2) (i.e. (L+R)/2) for variable nodes having left and right children nodes (children nodes are nodes at the terminus of branches leading from a particular node).

The step of calculating the vertices of the nodes has the effect of merging the Boolean and real domain functions and permitting optimization of the real-value function in the Boolean domain in a manner described below.

The number of vertices at each variable node may be computed manually or with a computer or the like. Referring to FIG. 5, the number of vertices at the set variable nodes P1 and P2 and of the constant leaf nodes having values of zero (0) and one (1) are indicated in small triangles adjacent each node.

In a step S4, a path from the root of the binary decision diagram to a set variable node having the least number of vertices is selected. Selecting the node with the least number of vertices leads to an optimized solution set for the function, since the number of vertices is directly related to the length of the interconnect. It is noted that all solutions for the Boolean function are captured by the binary decision diagram. Thus, there may be 0, 1, 2 or more solutions yielded, depending upon the particular problem.

In the example illustrated in FIG. 5, there are two paths leading from the root node (C1) to a set variable node having the least number of vertices. In this case, both set variable nodes P2 have the least number of vertices—two (2), and as such there are two paths providing optimized solutions to the function.

Referring to FIG. 1, in a step S5, the solution(s) to the real function is/are determined from the path(s). In the above-referenced example, a path leading from the right hand branch of node C1 (i.e. C1=1) and from the left-hand branch of C2 (i.e. C2=0) and thereon to nodes P1 and P2 provides a solution. A path leading from the left-hand branch of node C1 (i.e. C1=0) and from the right-hand branch of C2 (i.e. C2=1) provides another solution. The C1 and C2 values provided by each path comprise the bit-wise coordinates of the connecting point C of the two interconnect segments L1 and L2.

Referring to FIG. 6(a), the first path described above yields a solution for the segment interconnect point C=1,0. In this instance, segment L1 extends from point A to point C (at 1,0) and segment L2 extends from point C to point B. Likewise, FIG. 6(b) illustrates the interconnect for a solution to the function solution where the connecting point C of the segments L1 and L2 has coordinates (0,1) in accordance with the second path described above.

Confirmation of the function is realized in that the values of the coordinates for point P which are yielded by continuing these paths through the binary decision diagram places point P on the interconnect, as must occur in accordance with the Boolean function. For example, when following the left-hand branch from node C1, the values for point C are (0,1), as described above. The path continues to node P2 following the right-hand branch from node P1 (i.e. P1=1). Then, either branch leading from node P2 yields a solution, i.e. P=(1,0) or (1,1). Referring again to FIG. 6(a), a point P having either of these two coordinate sets lies along the interconnect path of this first optimized solution.

Advantageously, this method yields the shortest path or paths interconnecting the desired points, avoiding obstacles, and otherwise satisfying desired criteria (in this case, these criteria included that the interconnect segments extend along the Manhattan grids). This is accomplished by the method minimizing the number of vertices comprising connecting points between line segments. When the number of interconnects or vertices is minimized, then the number of line segments is minimized, since the total interconnect length is proportional to the number of vertices.

In the examples illustrated and described above, each interconnect had only a single vertex or point connecting two line segments. When larger values of "n" are chosen for the number of segments, the Boolean function F includes variables representing additional connecting points or vertices, and the binary decision diagram includes nodes for those variables. For example, if the value "n" is selected as three (3), then the interconnect may comprise three segments L1, L2 and L3 joined at a two points, such as C and D. In that instance, the Boolean function will include variables representing coordinates of point C (such as C1, C2) and D (such as D1, D2). The path through the binary decision diagram to a set variable node having a least number of vertices will yield the values for each of points C and D. In accordance with this example, it should be noted that this path from the root node to a set variable node having the least number of vertices may not pass through one or more of the variable nodes for which a solution is desired. This is an indication that the particular variable does not form a portion of the solution for the shortest interconnect. For example, if the path through the binary decision diagram in the above referenced examples passed through only the C variable nodes and no D variable nodes, it is clear that the solution is an interconnect having only two segments connected at a single point C.

It should be appreciated that the "real" or graphical solution can be readily reconciled with the solution yielded by the binary decision diagram. For example, in the above-referenced example, it can be visually observed that any solution must have two segments. This is verified by the binary decision diagram which yields this same solution. Of course, the method of the invention can be used to generate solutions even when no optimal solution is readily visible.

Those of skill in the art will appreciate that the number of vertices need not be calculated directly for each and every node of the binary decision diagram. All that may be necessary is the calculation of the number of vertices for the set variable nodes. Further, though the binary decision diagram is termed a "diagram," this ordering of the variable and constant nodes need not be done graphically or visibly, but can be done in a variety of manners, such as electronically by a computer.

As described above, the method of the invention may be utilized to optimize a variety of real functions in the Boolean domain and is not limited to the specific examples given above. For example, the method may be utilized to determine the shortest path between objects which are of arbitrary shape (and not necessarily having as their boundaries Manhattan grids). The method is also not limited to finding a shortest path between points, but has a variety of other applications where it is desirable to optimize a real value function.

Figure 7:
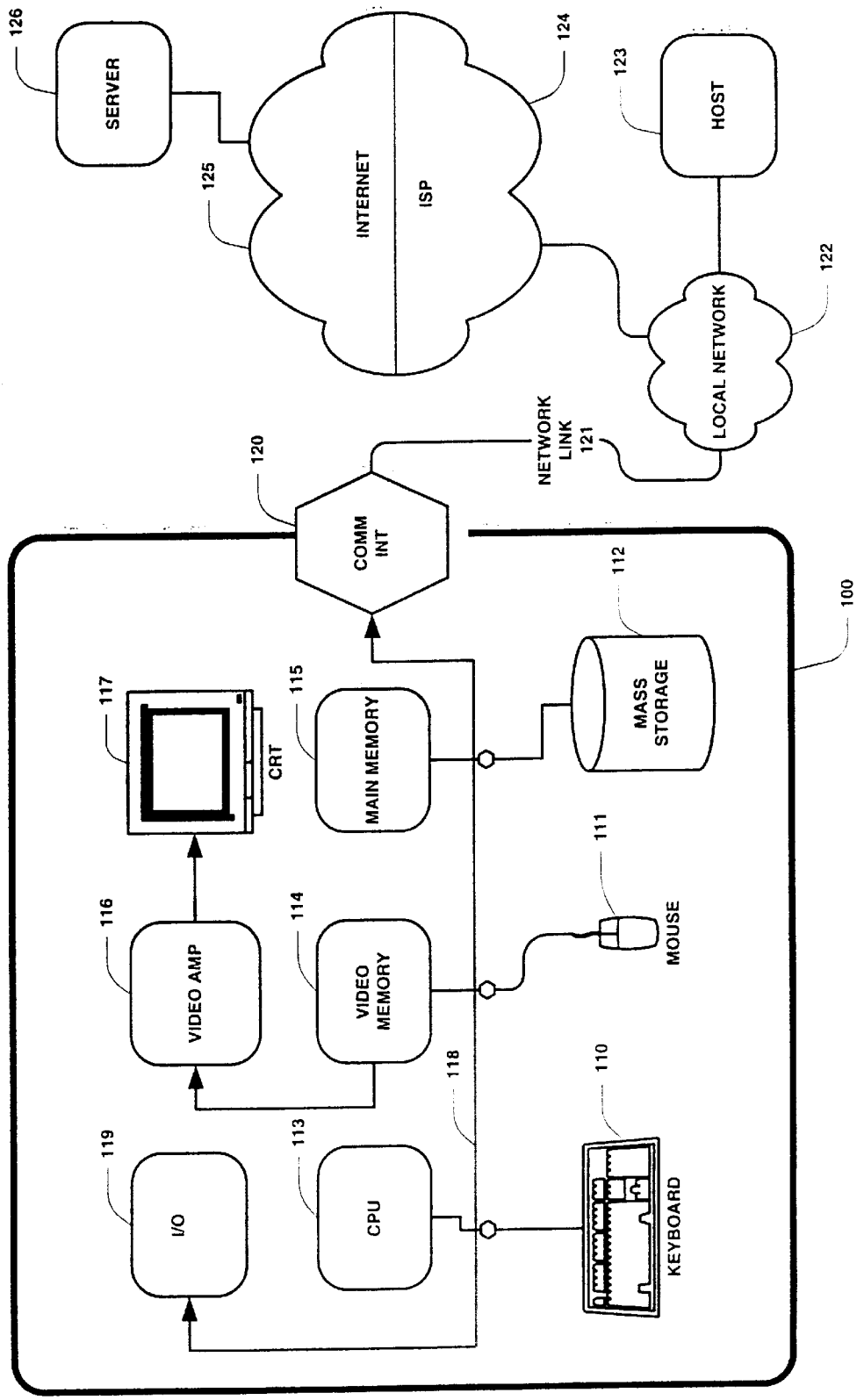
FIG. 7 is a block diagram of one embodiment of a computer system capable of providing a suitable execution environment for an embodiment of the invention.

Embodiment of Computer Execution Environment (Hardware) p An embodiment of the invention can be implemented as computer software in the form of computer readable code executed on a general purpose computer such as computer 100 illustrated in FIG. 7, or in the form of bytecode class files executable within a runtime environment (such as, e.g., a Java™ runtime environment) or any other suitable runtime environment running on such a computer or in the form of bytecodes running on a processor (or devices enabled to process bytecodes) existing in a distributed environment (e.g., one or more processors on a network).

Such a computer 100 may include, but is not limited to that illustrated in FIG. 7. In this arrangement, the computer 100 includes a keyboard 110 and mouse 111 are coupled to a system bus 118. The keyboard and mouse are for introducing user input to the computer system and communicating that user input to processor 113. Other suitable input devices may be used in addition to, or in place of, the mouse 111 and keyboard 110. I/O (input/output) unit 119 coupled to the system bus 118 represents such I/O elements as a printer, A/V (audio/video) I/O, etc.

Computer 100 includes a video memory 114, main memory 115 and mass storage 112, all coupled to the system bus 118 along with keyboard 110, mouse 111 and processor 113. The mass storage 112 may include both fixed and removable media, such as magnetic, optical or magnetic optical storage systems or any other available mass storage technology. Bus 118 may contain, for example, thirty-two address lines for addressing video memory 114 or main memory 115. The system bus 118 also includes, for example, a 64-bit data bus for transferring data between and among the components, such as processor 113, main memory 115, video memory 114 and mass storage 112. Alternatively, multiplex data/address lines may be used instead of separate data and address lines.

In one embodiment of the invention, the processor 113 is a SPARC™ microprocessor from Sun Microsystems, Inc. However, any other suitable microprocessor or microcomputer may be used, such as the 680x0 processor manufactured by Motorola, or a microprocessor manufactured by Intel, such as the 80x86 or Pentium processor. Main memory 115 is comprised of dynamic random access memory (DRAM). Video memory 114 is a dual-ported video random access memory. One port of the video memory 114 is coupled to video amplifier 116. The video amplifier 116 is used to drive the cathode ray tube (CRT) raster monitor 117. Video amplifier 116 is well known in the art and may be implemented by any suitable apparatus. This circuitry converts pixel data stored in video memory 114 to a raster signal suitable for use by monitor 117. Monitor 117 is a type of monitor suitable for displaying graphic images. Alternatively, the video memory could be used to drive a flat panel or liquid crystal display (LCD), or any other suitable data presentation device.

Computer 100 may also include a communication interface 120 coupled to bus 118. Communication interface 120 provides a two-way data communication coupling via a network link 121 to a local network 122. For example, if communication interface 120 is an integrated services digital network (ISDN) card or a modem, communication interface 120 provides a data communication connection to the corresponding type of telephone line, which comprises part of network link 121. The communication interface 120 could also be a cable modem or wireless interface. In any such implementation, the communication interface 120 sends and receives electrical, electromagnetic or optical signals which carry digital data streams representing various types of information.

Network link 121 typically provides data communication through one or more networks to other data devices. For example, network link 121 may provide a connection through local network 122 to local server computer 123 or to data equipment operated by an Internet Service Provider (ISP) 124. ISP 124 in turn provides data communication services through the world wide packet data communication network now commonly referred to as the "Internet" 125. Local network 122 and Internet 125 both use electrical, electromagnetic or optical signals which carry digital data streams. The signals through the various networks and the signals on network link 121 and through communication interface 120, which carry the digital data to and from computer 100, are exemplary forms of carrier waves transporting the information.

Computer 100 can send messages and receive data, including program code, through the network(s), network link 121, and communication interface 120. In the Internet example, remote server computer 126 might transmit a requested code for an application program through Internet 125, ISP 124, local network 122 and communication interface 120.

The received code may be executed by processor 113 as it is received, and/or stored in mass storage 112, or other non-volatile storage for later execution. In this manner, computer 100 may obtain application code in the form of a carrier wave.

Application code may be embodied in any form of computer program product. A computer program product comprises a medium configured to store or transport computer readable code or data, or in which computer readable code or data may be embedded. Some examples of computer program products are CD-ROM disks, ROM cards, floppy disks, magnetic tapes, computer hard drives, servers on a network, and carrier waves.

The computer systems described above are for purposes of example only. An embodiment of the invention may be implemented in any type of computer system or programming or processing environment.

Figure 8:
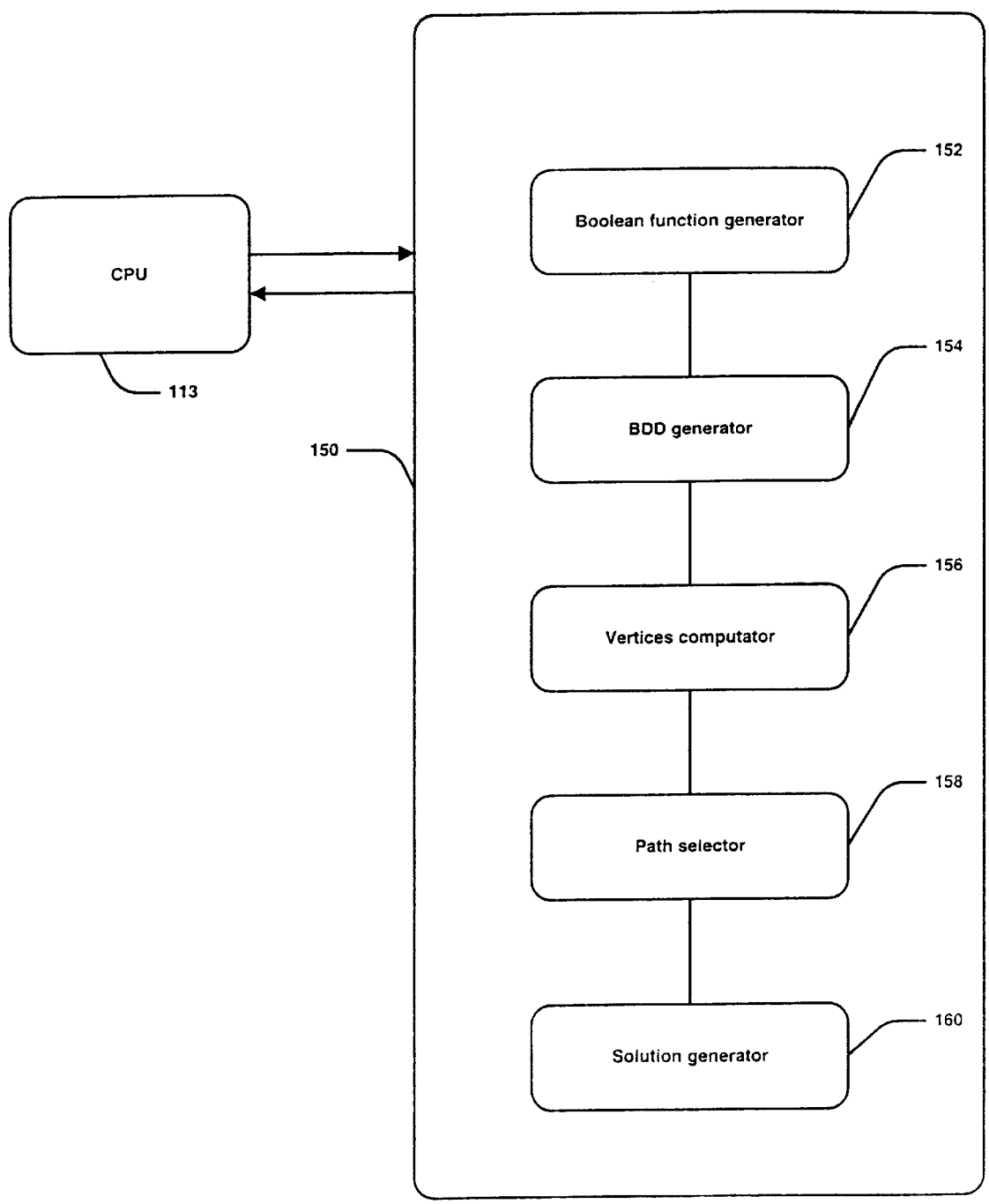
FIG. 8 is a block diagram of a system for optimizing a real function in Boolean domain in accordance with an embodiment of the present invention.

In one or more embodiments of the invention, and as illustrated in FIG. 8, the computer 100 includes a system 150 for optimizing a real function in Boolean domain. The system 150 may be connected to the CPU 113 of the computer 100.

In one embodiment, the system 150 includes a Boolean function generator 152. In one or more embodiments, the generator 152 performs step S1 of the method illustrated in FIG. 1, and steps S101–104 of the method illustrated in FIG. 2. The system 150 also includes a binary decision diagram generator 154 which generates the binary decision diagram of the Boolean function generated by the Boolean function generator 152.

A vertex computator 156 computes the number of vertices for the one or more nodes of the binary decision diagram. A path selector 158 selects a path through the binary decision diagram as described in detail in conjunction with step S4 of FIG. 1. The system 150 also includes a solution generator 160 which generates the solutions for the function based on the selected path(s).

As will be appreciated by those of skill in the art, there are a wide variety of configuration for hardware and software for accomplishing the method of the invention other than that described above.

Of course, the foregoing description is that of preferred embodiments of the invention, and various changes and modifications may be made without departing from the spirit and scope of the invention, as defined by the claims.

What is claimed is:

1. In a computer system, a method of optimizing a real function in a Boolean domain comprising:

expressing a real function in an electric circuit as a Boolean function;

determining a binary decision diagram for said Boolean function, said binary decision diagram having a root and at least one variable node;

determining a number of vertices corresponding to said at least one variable node of the binary decision diagram;

selecting a path from said root to said at least one variable node of said binary decision diagram having a least number of said corresponding vertices; and determining solution values for one or more of said variable nodes of said Boolean function in accordance with said selected path through said binary decision diagram.

2. The method of claim 1 wherein expressing said real function as said Boolean function comprises:

encoding a space including at least two points to be connected;

determining a line in said space with a first Boolean function; and determining a second Boolean function representing an "n"-segment line connecting said at least two points from said first Boolean function.

3. The method in accordance with claim 2 wherein said encoding step comprises Grey-coding.

4. The method in accordance with claim 2 further modifying said second Boolean function to comprise constraining criteria.

5. The method in accordance with claim 4 wherein said constraining criteria comprises an obstacle to be avoided by a line connecting said at least two points.

6. A computer program product comprising:

a computer usable medium having computer readable program code embodied therein for circuit design comprising:

computer readable program code configured to cause a computer to express a real function as a Boolean function, wherein said computer readable program code is embedded in an electronic circuit;

computer readable program code configured to cause a computer to determine a binary decision diagram for said Boolean function, said binary decision diagram having a root and at least one variable node;

computer readable program code configured to cause a computer to determine a number of vertices corresponding to said at least one variable node of the binary decision diagram;

computer readable program code configured to cause a computer to select a path from said root to said at least one variable node of said binary decision diagram having a least number of said vertices; and computer readable program code configured to cause a computer to determine solution values for one or more of said variables nodes of said Boolean function in accordance with said selected path through said binary decision diagram.

7. The computer program product of claim 6 wherein said computer readable program code configured to cause a computer to express said real function as a Boolean function is configured to:

Grey-code a space having two or more points to be connected;

generate a first Boolean function representing a line in said space;

generate a second Boolean function representing an "n"-segment line connected said at least two points to be connected based on said first Boolean function; and determine said binary decision diagram for said second Boolean function.

8. The computer program product in accordance with claim 7 wherein said computer readable program code configured to cause a computer to express said real function as a Boolean function is further configured to modify said second Boolean function to include one or more constraints.

9. The computer program product in accordance with claim 8 wherein said one or more constraints comprises an obstacle in said space to be avoided.

10. A computer system comprising:

a processor;

a circuit for optimizing a real function in Boolean domain comprising:

said circuit comprising a Boolean function generator for generating a Boolean function representing said real function;

said circuit comprising a binary decision diagram generator for generating a binary decision diagram of said Boolean function;

said circuit comprising a vertex computator for determining the number of vertices of one or more nodes of said binary decision diagram;

said circuit comprising a path selector for selecting a path from a root of said binary decision diagram to a variable node of said binary decision diagram having a least number of said vertices; and said circuit comprising a solution generator for generating solution values for one or more of said variables nodes of said Boolean function in accordance with said selected path from said binary decision diagram.

11. The computer system of claim 10 wherein said Boolean function generator for generating a Boolean function representing said real function comprises a system to:

encode a space including at least two points to be connected;

determine a line in said space with a first Boolean function; and determine a second Boolean function representing an "n"-segment line connecting said at least two points from said first Boolean function.

12. The computer system of claim 11 wherein said system to encode said space comprises Grey-coding.

13. The computer system of claim 11 wherein said system to determine said second Boolean function comprises constraining criteria.

14. The computer system of claim 13 wherein constraining criteria comprises an obstacle to be avoided by a line connecting said at least two points.

15. A computer system comprising:

a processor;

a circuit for optimizing a real function in Boolean domain comprising:

said circuit comprising Boolean function generating means for generating a Boolean function representing said real function;

said circuit comprising binary decision diagram generating means for generating a binary decision diagram of said Boolean function;

said circuit comprising vertex computing means for determining the number of vertices of one or more nodes of said binary decision diagram;

said circuit comprising path selecting means for selecting a path from a root of said binary decision diagram to a variable node of said binary decision diagram; and said circuit comprising solution generating means for generating solution values for one or more of said variable nodes of said Boolean function in accordance with said selected path from said binary decision diagram.

16. The computer system of claim 15 wherein said Boolean function generating means for generating a Boolean function representing said real function comprises:

means for encoding a space including at least two points to be connected;

means for determining a line in said space with a first Boolean function; and means for determining a second Boolean function representing an "n"-segment line connecting said at least two points from said first Boolean function.

17. The computer system of claim 16 wherein said means for encoding comprises Grey-coding.

18. The computer system of claim 16 wherein said means for determining said second Boolean function comprises constraining criteria.

19. The computer system of claim 18 wherein constraining criteria comprises an obstacle to be avoided by a line connecting said at least two points.

* * * * *